United States Patent [19]
Kirisawa et al.

[11] Patent Number: 5,978,265
[45] Date of Patent: Nov. 2, 1999

[54] NON-VOLATILE SEMICONDUCTOR MEMORY DEVICE WITH NAND TYPE MEMORY CELL ARRAYS

[75] Inventors: Ryouhei Kirisawa, Yokohama; Riichiro Shirota, Kawasaki; Ryozo Nakayama, Yokohama; Seiichi Aritome, Kawasaki; Masaki Momodomi, Yokohama; Yasuo Itoh, Kawasaki; Fujio Masuoka, Yokohama, all of Japan

[73] Assignee: Kabushiki Kaisha Toshiba, Kawasaki, Japan

[21] Appl. No.: 07/746,176

[22] Filed: Aug. 15, 1991

Related U.S. Application Data

[63] Continuation of application No. 07/411,927, Sep. 25, 1989, abandoned.

[30] Foreign Application Priority Data

Sep. 30, 1988 [JP] Japan .................................. 63-246105

[51] Int. Cl.$^6$ .................................................. G11C 11/34
[52] U.S. Cl. .............................. 365/185.17; 365/185.28; 365/185.29
[58] Field of Search .................................. 365/184, 218, 365/189.09, 189.11, 185.17, 185.28, 185.29

[56] References Cited

U.S. PATENT DOCUMENTS

| | | | |
|---|---|---|---|
| 4,677,590 | 6/1987 | Arakawa | 365/185 |
| 4,939,690 | 7/1990 | Momodomi et al. | 365/185 |
| 4,959,812 | 9/1990 | Momodomi et al. | 365/185 |
| 4,962,481 | 10/1990 | Choi et al. | 365/185 |
| 4,996,669 | 2/1991 | Endoh | 365/185 |
| 5,008,856 | 4/1991 | Iwahashi | 365/185 |
| 5,031,011 | 7/1991 | Aritome et al. | 365/185 |
| 5,050,125 | 9/1991 | Momodomi et al. | 365/185 |
| 5,075,890 | 12/1991 | Itoh et al. | 365/185 |

FOREIGN PATENT DOCUMENTS

| | | |
|---|---|---|
| 0322 900 | 7/1989 | European Pat. Off. . |
| 60-8559 | 3/1985 | Japan . |
| 60-182162 | 9/1985 | Japan . |
| 62-155568 | 7/1987 | Japan . |

OTHER PUBLICATIONS

IBM Technical Disclosure Bulletin, vol. 27, No. 6, Nov. 1984, New York, pp. 3302–3307; Adler, "Densely Arrayed EEPROM Havig Low Voltage Tunnel Write".

1988 Symposium On VLSI Technology, May 10, 1988, San Diego, CA, pp. 33–34; Shirota et al, "A New Nand Cell for Ultra High Density 5V Only EEPROMS".

International Electron Devices Meeting, Dec. 6, 1987, Washington, D.C., pp. 552–555; Masuoka et al, "New Ultra High Density EPROM and Flash EEPROM With Nand Structure Cell".

"A High Density EPROM Cell and Array", R. Stewart et al, RCA David Sarnoff Research Center, Route 1, Princeton, N.J. 08540 VII—9, pp. 89–90 Symposium on VLSI Technology Oiliest of Technical Papers, May 1986.

Primary Examiner—A. Zarabim
Attorney, Agent, or Firm—Oblon, Spivak, McClelland, Maier & Neustadt, P.C.

[57] ABSTRACT

An electrically erasable programmable read-only memory is disclosed which has programmable memory cells connected to parallel bit lines provided above a semiconductor substrate. The memory cells include NAND cell blocks each of which has a series array of memory cell transistors. Parallel word lines are connected to the control gates of the memory cell transistors, respectively. In a data write mode, a selection transistor in a certain NAND cell block including a selected memory cell is rendered conductive to connect the certain cell block to a corresponding bit line associated therewith. Under such a condition, electrons are tunnel-injected into a floating gate of the selected memory cell transistor, and the threshold value of the certain transistor is increased to be a positive value. A logical data is thus written in the selected memory cell transistor. The data in the selected cell transistor is erased by discharging carriers accumulated in the floating gate thereof to its drain or the substrate, so that the threshold value of the certain transistor is decreased to be a negative value.

34 Claims, 12 Drawing Sheets

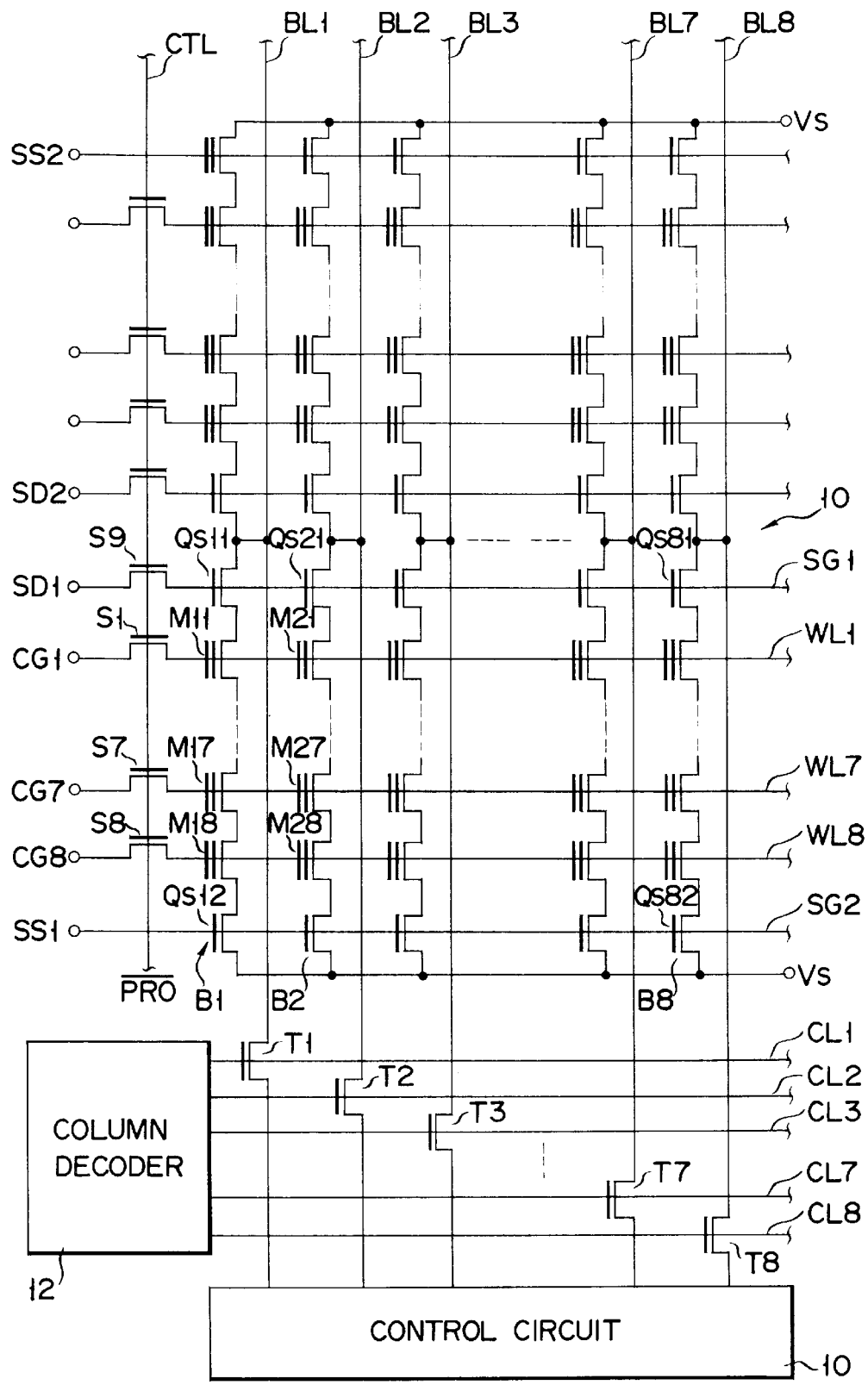
F I G. 1

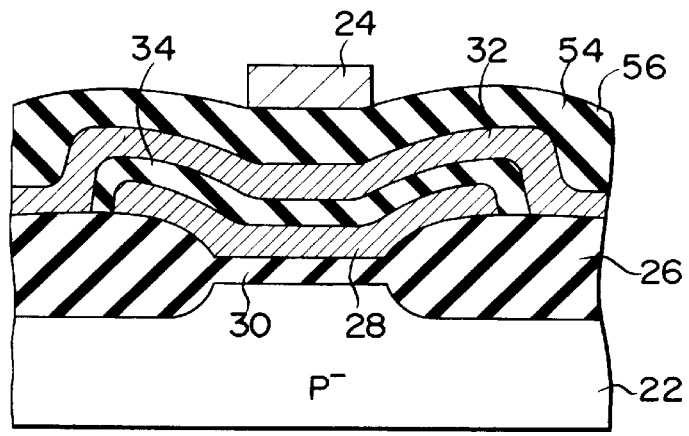
F I G. 3
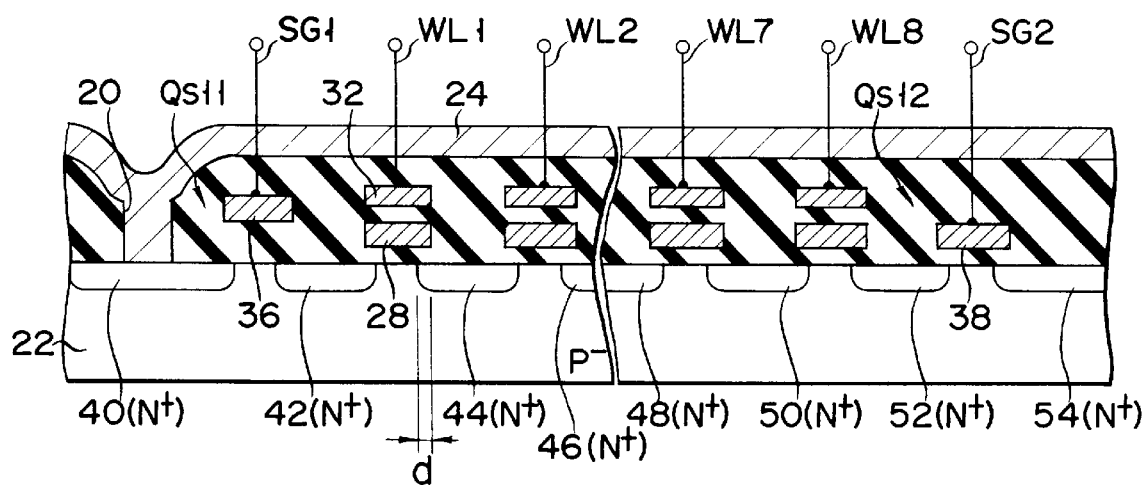
F I G. 4

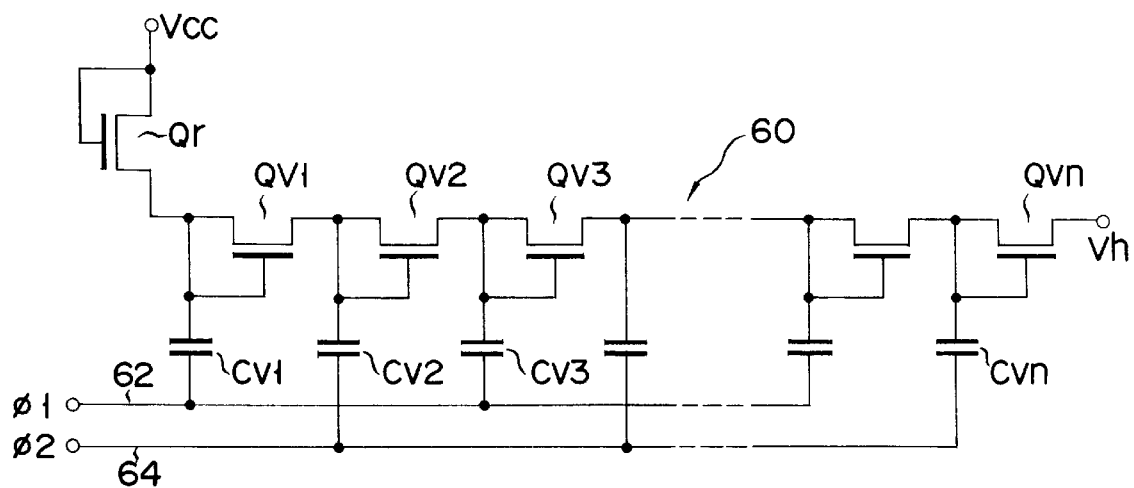
F I G. 5
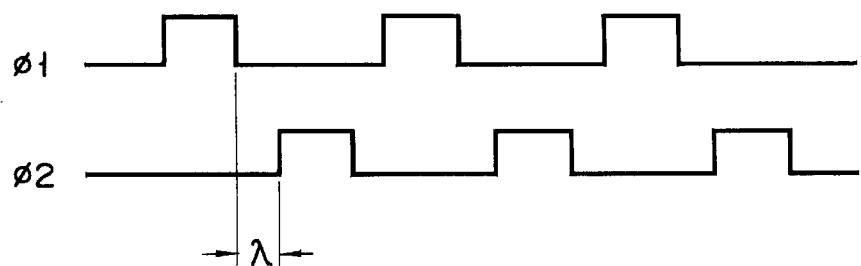
F I G. 6

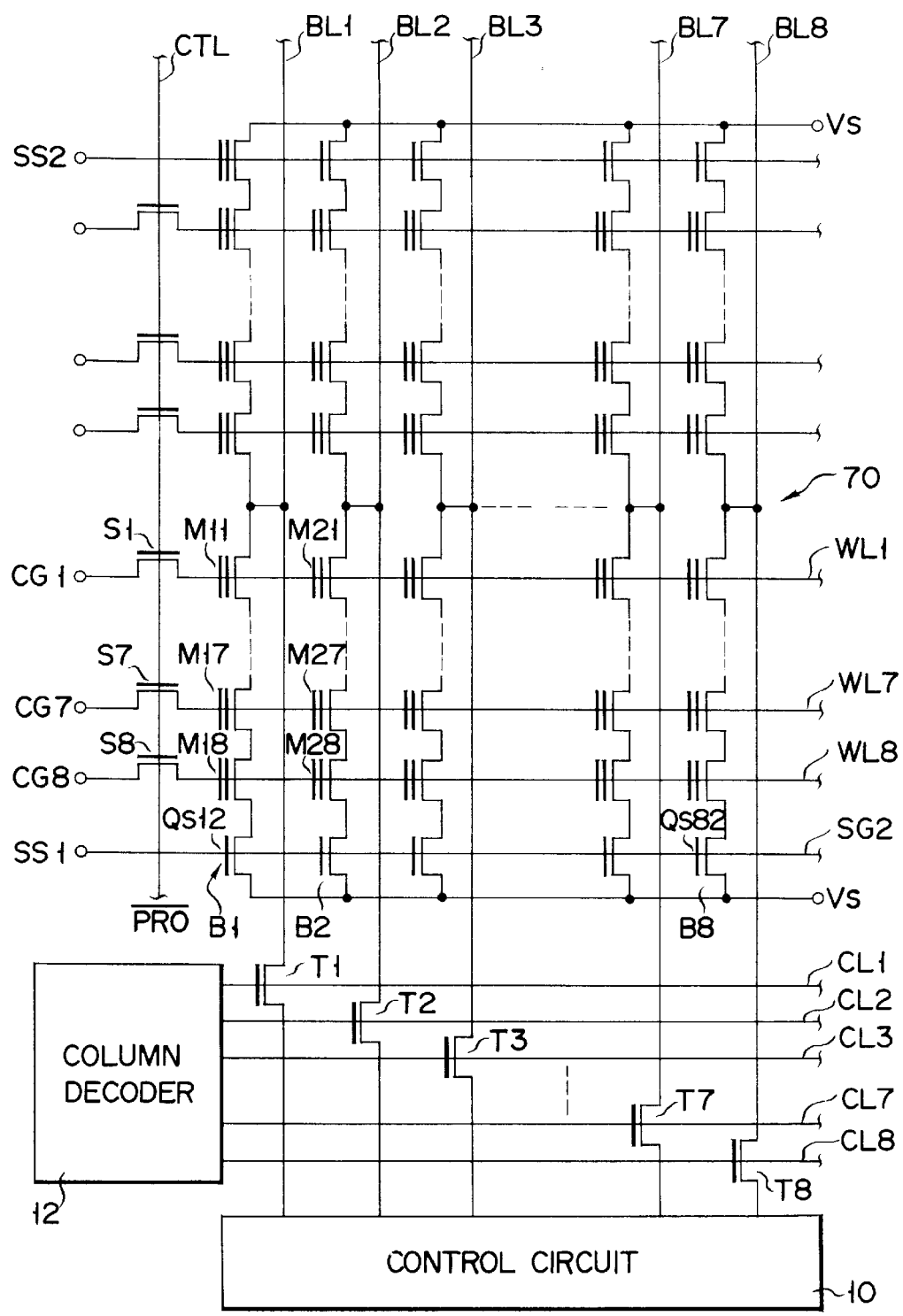
F I G. 10

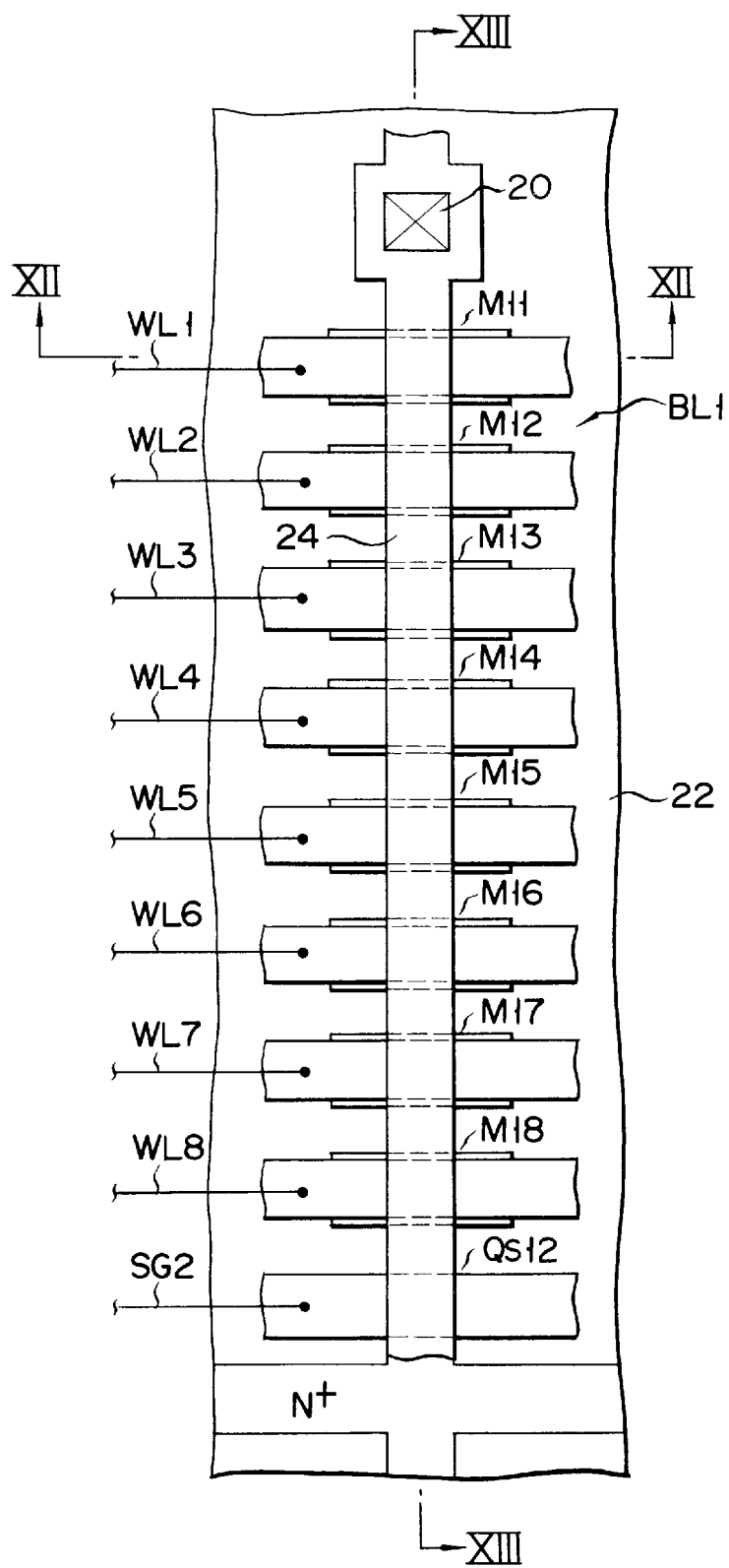
F I G. 11

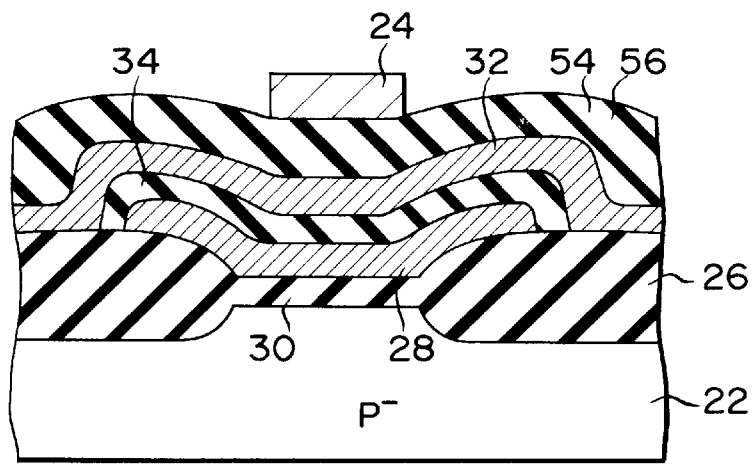
F I G. 12
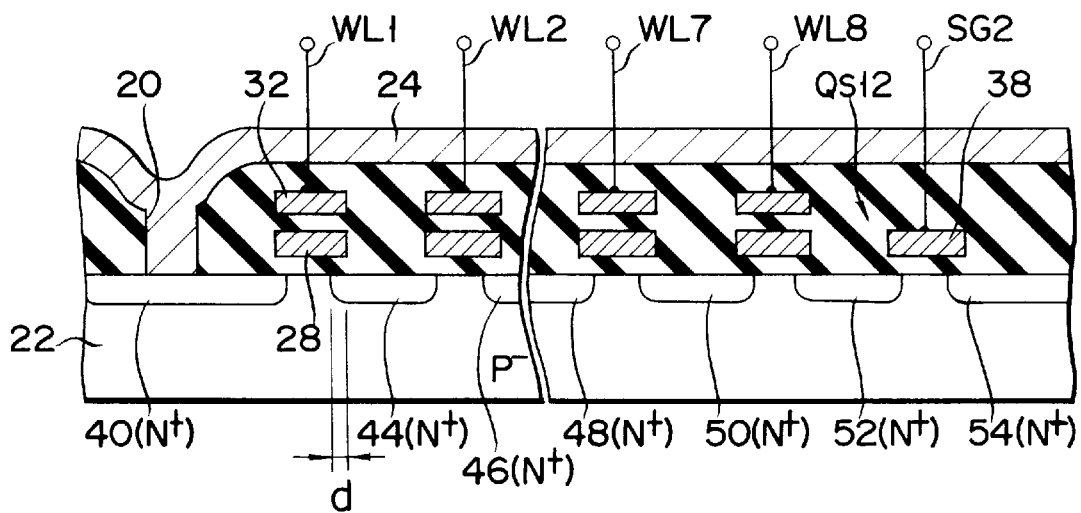
F I G. 13

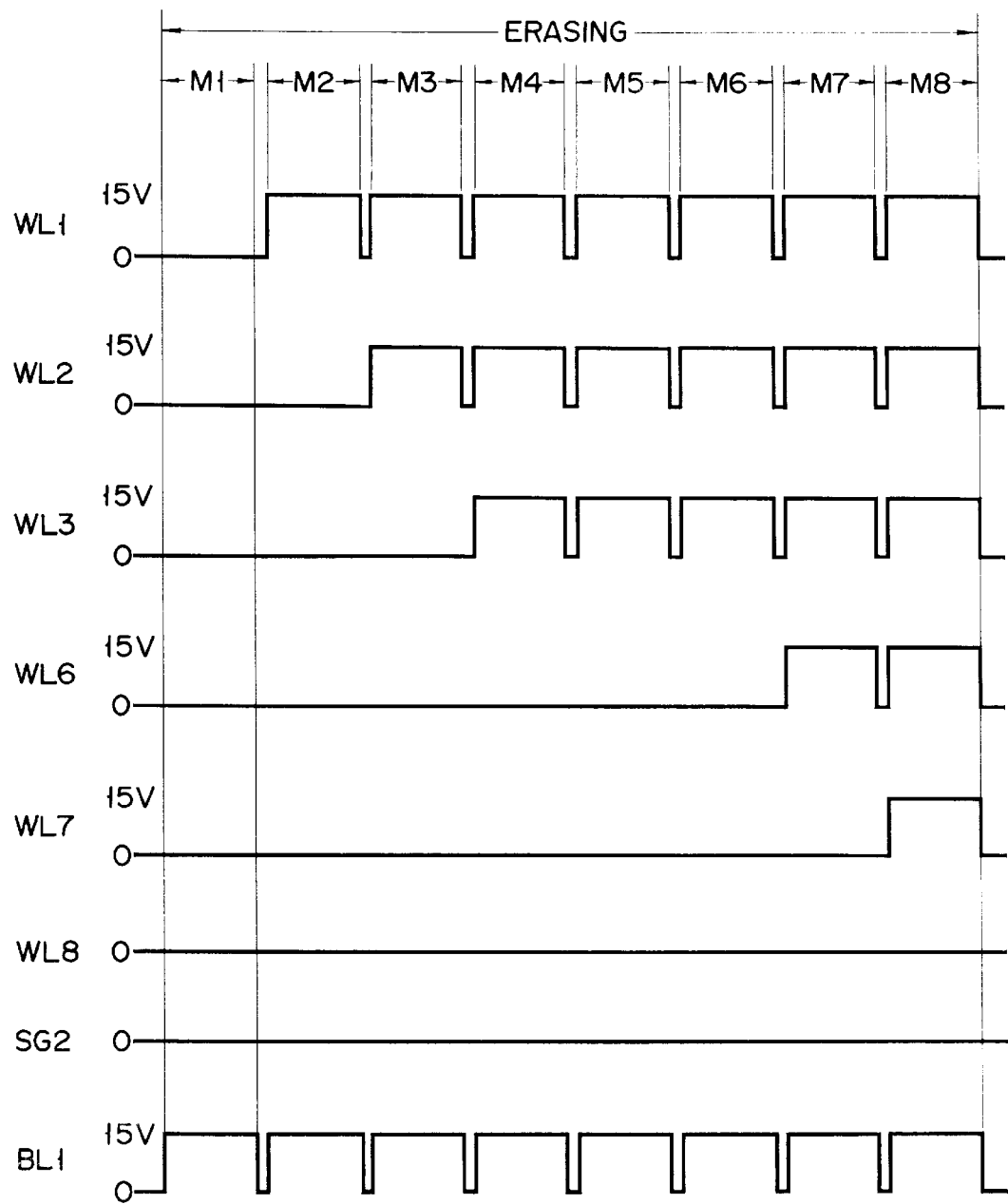
F I G. 14

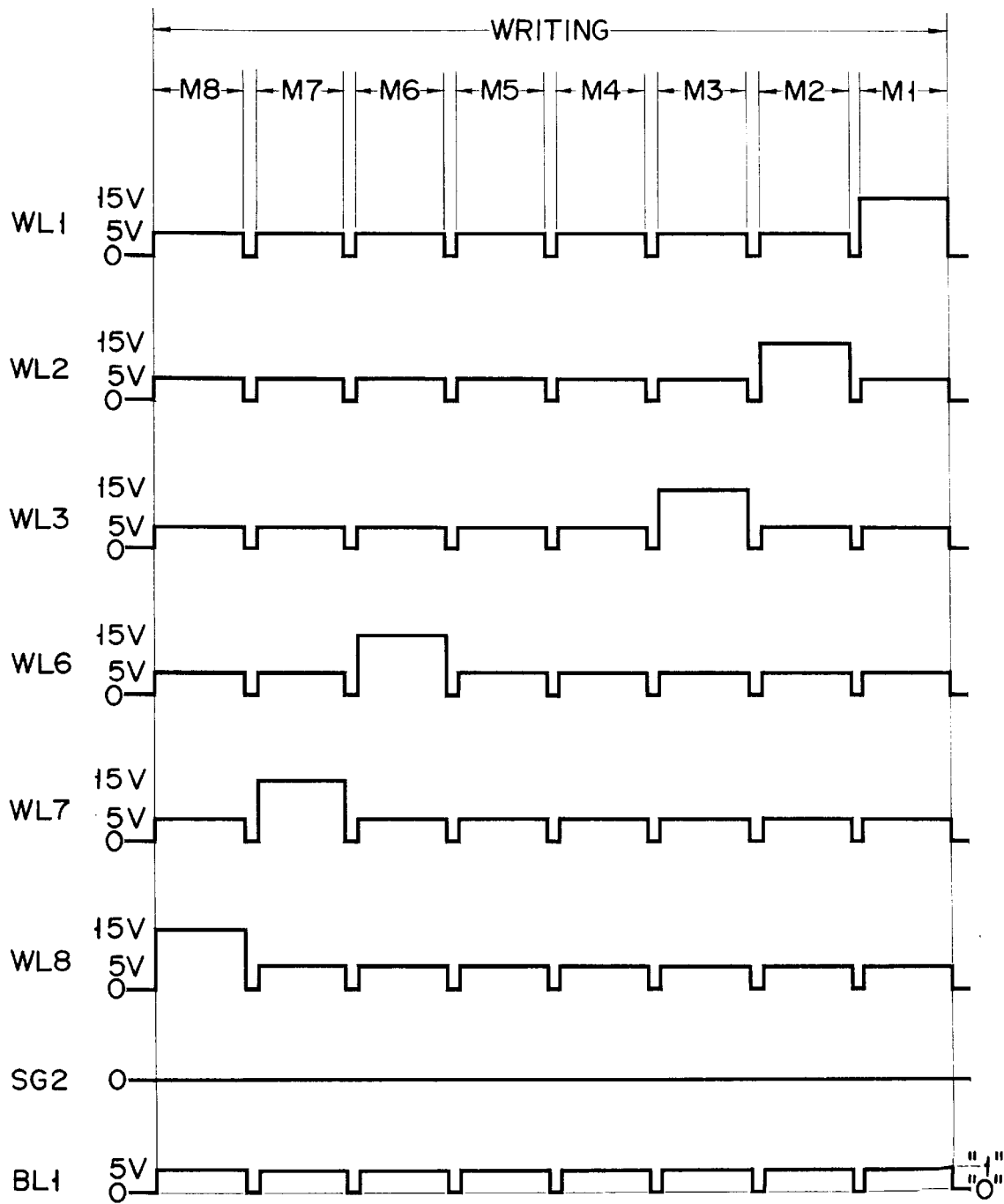
F I G. 15

NON-VOLATILE SEMICONDUCTOR MEMORY DEVICE WITH NAND TYPE MEMORY CELL ARRAYS

This application is a continuation of application Ser. No. 07/411,927, filed on Sep. 25, 1989, now abandoned.

BACKGROUND OF THE INVENTION

1. Field of the Invention

The present invention relates to nonvolatile dynamic semiconductor memories and, more particularly, to an electrically erasable programmable read-only memory.

2. Description of the Related Art

With the increasing needs for high performance and reliability of digital computer systems, there has been strongly demanded a semiconductor memory having a large data storage capacity for replacing an existing external data storage device such as a magnetic floppy disk drive unit, a fixed disk unit, etc. Although presently available electrically erasable programmable read-only memories have a technical merit such that a high-speed data write/read operation can be realized with high reliability, these memories have not been improved to obtain a sufficient data storage capacity.

One reason for the above problem is as follows. That is, in a conventional electrically erasable programmable read-only memory (to be referred to as an "EEPROM" hereinafter), each memory cell for storing 1-byte data is basically constituted by two transistors. With such an arrangement, only when a specific high-integration element fabrication technique is employed, a cell area on a chip substrate cannot simply be decreased. According to the existing semiconductor fabrication technology, a satisfactory specific element fabrication technique for this purpose is not established. Even if such a specific element fabrication technique is established, low productivity prevents practical applications of the technique.

In order to solve the above problem, recently, a specific type of EEPROM having a "NAND cell" structure has been proposed wherein each memory cell is constituted by only one transistor (field effect transistor), and a number of memory cells are connected in series in each array, whereby the number of contact portions between the cell array and the corresponding bit line is remarkably decreased, so that the integration density can be greatly improved.

The presently proposed "NAND cell" type EEPROM, however, suffers from insufficient efficiency of a data write operation. More specifically, according to the existing NAND cell type EEPROM, a state wherein electrons are tunnel-injected into a floating gate of each memory cell so that a threshold value of each memory cell transistor is shifted in the positive direction is defined as an "erase state". When a certain memory cell is selected and logical data is written therein, the NAND array to which the certain memory cell belongs is electrically connected to a corresponding bit line. When the potential of write data is transferred from the corresponding bit line to the selected memory cell through non-selected memory cell transistors in the NAND cell array, a voltage drop necessarily occurs in each of these non-selected memory cell transistors. The voltage drop causes a decrease in effective potential of the write data supplied from the bit line, thus degrading the efficiency of a write operation.

In particular, when the integration density of the EEPROM is increased and the number of memory cells arranged in each NAND cell array is increased along with the increase in integration density, the above-mentioned voltage drop is further increased. Therefore, it may be easily imagined that a problem of a decrease in write efficiency in the EEPROM becomes more serious.

Even if the integration density of the EEPROM remains the same, when a large number of write and erase operations of data are repeated, in the NAND cell array, the threshold values of the non-selected memory cells located between the corresponding bit line associated therewith and the selected memory cell tend to be gradually increased upon each data erase operation. Since this gradual increase in threshold values prevents effective transfer of the write data in the selected memory cell in the NAND cell array, the write efficiency is degraded, as a matter of course. In addition, if the threshold values of these non-selected memory cells are simply increased to exceed a predetermined read voltage in the EEPROM, a reliable data read operation cannot be performed, and the probability of generation of read error is undesirably increased.

SUMMARY OF THE INVENTION

It is therefore an object of the present invention to provide a new and improved non-volatile semiconductor memory device.

It is another object of the present invention to provide a new and improved electrically erasable programmable read-only memory having excellent operation reliability, which is highly-integrated to have a large data storage capacity.

In accordance with the above objects, the present invention is addressed to a specific non-volatile semiconductor memory device which comprises parallel bit lines provided above a semiconductor substrate, and programmable memory cells connected to the bit lines. These memory cells are divided into NAND cell blocks, each of which has a series array of memory cell transistors connected at a first node thereof to a corresponding bit line associated therewith and connected at a second node thereof to the substrate. Each of the memory cell transistors has a carrier storage layer and a control gate. Electric charges such as electrons are tunnel-injected into the carrier storage layer of the selected memory cell transistor and the threshold value of the cell transistor is increased to be a positive value. Therefore, a logical data is written into the selected cell transistor. The carriers accumulated in the carrier storage layer of the selected cell transistor are discharged to its drain or the substrate, so that the threshold value of the cell transistor is decreased to be a negative value, thus erasing the data in the selected cell transistor.

The present invention and its objects and advantages will become more apparent in a detailed description of preferred embodiments to be presented below.

BRIEF DESCRIPTION OF THE DRAWINGS

In the detailed description of preferred embodiments of the present invention presented below, reference is made to the accompanying drawings of which:

FIG. 1 is a schematic diagram showing a circuit configuration of a memory cell matrix section in an electrically erasable programmable read-only memory (EEPROM) and its peripheral circuit according to a preferred embodiment of the present invention;

FIG. 3 is a diagram showing a cross-sectional view of the cell block taken along line III—III in FIG. 2;

FIG. 4 is a diagram showing another cross-sectional view of the cell block taken along line IV—IV in FIG. 2;

FIG. 5 is a diagram showing a circuit configuration of a booster circuit provided in the EEPROM;

FIG. 6 is a diagram showing waveforms of main signals generated in the main parts of the booster circuit of FIG. 6;

FIG. 10 is a schematic diagram showing a circuit configuration of a memory cell matrix section in an electrically erasable programmable read-only memory (EEPROM) and its peripheral circuit according to another embodiment of the present invention;

FIG. 11 is a diagram showing a plan view of a cell block including a selection transistor and memory cell transistors which are series-connected so as to constitute a "NAND cell" structure;

FIG. 12 is a diagram showing a cross-sectional view of the cell block taken along line XII—XII in FIG. 11;

FIG. 13 is a diagram showing another cross-sectional view of the cell block taken along line XIII—XIII in FIG. 11;

FIG. 14 is a diagram showing some typical waveforms of voltage signals which are generated at the main parts of the EEPROM of FIG. 10 in the data erase mode thereof; and FIG. 15 is a diagram showing some typical waveforms of voltage signals which are generated at the main parts of the EEPROM of FIG. 10 in the data write mode thereof.

DETAILED DESCRIPTION OF THE PREFERRED EMBODIMENTS

Figure 2:
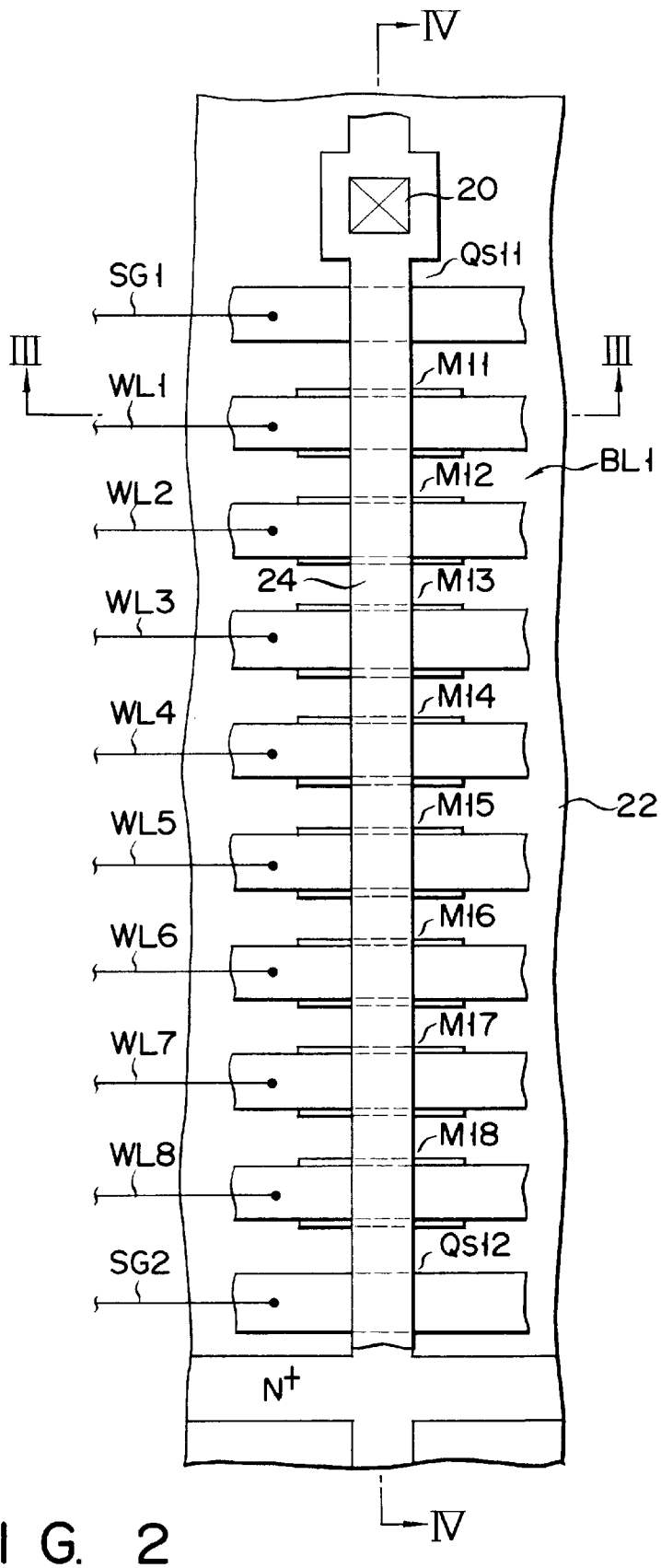
FIG. 2 is a diagram showing a plan view of a cell block including two selection transistors and memory cell transistors which are series-connected so as to constitute a "NAND cell" structure.

In FIG. 1, an EEPROM according to a preferred embodiment of the present invention has a memory cell matrix section generally designated by reference numeral "10". The memory cell section 10 includes a selected number of parallel bit lines BL1, BL2, . . . , BL8 (arbitrary one of these bit lines is represented by reference symbol "BLi" hereinafter), parallel word lines WL1, WL2, . . . , WL8, and memory cells M respectively arranged at the intersecting points of these bit and word lines.

As shown in FIG. 1, the memory cells M connected to the bit lines BL in the memory cell section 10 are divided into subarrays (to be referred to as "NAND cell blocks" or simply "cell blocks" hereinafter) B1, B2, . . . , B8, each of which has first and second transistors (selection transistors) Qsi1 and Qsi2 ("i" is a number of the bit line), and a selected number of memory cells M. Each of the selection transistors Qsi1 and Qsi2 is constituted by a single gate type MOSFET. Each memory cell M is basically constituted by a double gate type MOSFET which has a floating gate and a control gate. Note that, referring to FIG. 1, only the NAND cell blocks B1, B2, . . . , B8 respectively connected to the eight bit lines BL1, BL2, . . . , BL8 are shown in detail for the sake of illustrative convenience.

In a series array of the transistors in each NAND cell block Bi, its one terminal (i.e., the drain of the memory cell transistor Mi1) is connected to a corresponding bit line BLi through the first selection transistor Qsi1, and the other terminal (i.e., the source of the memory cell transistor Mi8) thereof is connected to a corresponding source potential (substantial potential or ground potential) Vs through the second selection transistor Qsi2. The memory cells M in each cell block Bi are constituted by series-connected memory cell transistors Mi1, Mi2, . . . , Min so as to constitute a so-called "NAND cell" structure. In the following description, the number of memory cell transistors included in each cell block is set to be "8" for the sake of illustrative convenience, however, the number will be set to be "16" or more, in practice.

The selection and memory transistors Qs and M are connected to nodes of the bit and word lines BL and WL, as shown in FIG. 1 to constitute a cell matrix. Note that lines SG1 and SG2 respectively connected to the first and second selection transistors Qsi1 and Qsi2 are often referred to as "gate control lines" in this description.

The word lines WL1 to WL8 are connected to control gate terminals CG1 to CG8 through transistors S1 to S8 (each having a gate connected to a control line CTL), respectively. The gate control line SG1 connected to the gate electrodes of the first selection transistors Qs11, Qs21, . . . , Qs81 is connected to a terminal SD1 through a transistor S9 which has a gate connected to the control line CTL. The second gate control line SG2 connected to the gate electrodes of the second selection transistors Qs12, Qs22, . . . , Qs82 is directly connected to a terminal SS1. The bit lines BL1 to BL8 are connected to a control circuit 10 through transistors T1 to T8, respectively. The gates of the transistors T1 to T8 are connected to column lines CL1 to CL8, respectively. The column lines CL1 to CL8 are connected to a column decoder 12.

As shown in FIG. 2, one NAND cell block (e.g., "B1") has a contact hole 20 in a lightly-doped P type silicon chip substrate 22. A connection wiring layer 24 is insulatively formed above the series-connected selection transistors Qs11 and Qs12 and the memory cell transistors M11 to M18. The connection wiring layer 24 may be an aluminum layer which extends parallel to the array of the transistors Qs and M.

The cross-sectional views of this embodiment are shown in FIGS. 3 and 4. The NAND cell transistor array in the NAND cell block BE is formed in a substrate surface area on the P-type silicon substrate 22 surrounded by an insulative layer 26 for isolating elements. As is most apparent from FIG. 3, a MOSFET M11 (other memory cells have the same arrangement as that of the MOSFET M11) constituting one memory cell includes a first polysilicon layer 28 insulatively disposed above the substrate 22 through a thermal oxide film 30, and a second polysilicon layer 32 insulatively disposed above the layer 28 through a thermal oxide insulative layer 34. The first polysilicon layer 28 serves as a floating gate (carrier storage layer) of the MOSFET Mi, whereas the second polysilicon layer 32 serves as a control gate of the MOSFET Mi. The control gate 32 continuously extends in one direction to constitute the word line (a word line WL1 in the case of the memory cell M1). The selection transistor Qs1 includes a polysilicon layer 36 insulatively disposed above the substrate 22. The selection transistor Qs2 includes a polysilicon layer 38 insulatively disposed above the substrate 22. These polysilicon layers 36 and 38 serve as control gates of the selection transistors Qs1 and Qs2, respectively.

As shown in FIG. 3, the floating gate 28 extends onto the element isolation insulative layer 26, whereby a coupling capacitance Cfs between the floating gate 28 and the substrate 22 in each cell Mi is set smaller than a coupling capacitance Ccs between the floating gate 28 and the control gate 32, so that a write/erase operation of data can be performed by only moving electrons by a tunnel effect between the floating gate 28 and the substrate 22.

As shown in FIG. 4, heavily-doped N type diffusion layers 40, 42, 44, 46, 48, 50, 52, and 54 are formed on a surface portion of the substrate 22. These N type diffusion layers slightly overlap the gates of the transistors Qs and M, respectively. These N type diffusion layers serve as sources and drains of the corresponding transistors. For example, the N diffusion layers 40 and 42 respectively serve as the drain and source of the selection transistor Qs1. Similarly, the N diffusion layers 42 and 44 respectively serve as the drain and source of the cell transistor M1.

The above structure is entirely covered with a CVD insulative layer 56. The above-mentioned contact hole 20 is formed in the CVD insulative layer 56. The aluminum connection wiring layer 24 is formed on the CVD insulative layer 56, extends along the series connection of the transistors Qs and M, and overlaps the gates of the transistors Qs and M included in the cell block B1. The contact hole 20 is located on the drain diffusion layer 40 of the selection transistor Qs1. The connection wiring layer 24 is electrically in contact with the drain of the selection transistor Qs1 through the contact hole 20 to serve as a bit line of the NAND cell array.

According to this embodiment, each control and floating gate of the corresponding memory cell transistor has a width of 1 μm and a channel width of 1 μm. The floating gate extends from both sides of the wiring layer 24 having a width of 1 μm by 1 μm. The first gate insulative film 30 (see FIG. 3) is a thermal oxide film having a thickness of, e.g., 10 nanometers, and the second gate insulative film 34 is a thermal oxide film having a thickness of, e.g., 25 nanometers. The coupling capacitances Cfs and Cfc in this case are obtained as follows:

$$Cfs = \epsilon/0.01$$

$$Cfc = 3 \cdot \epsilon/0.025$$

where "$\epsilon$" is the dielectric constant of these thermal oxide films. As a result, it is demonstrated that the NAND cell structure in this embodiment satisfies the above-mentioned conditions.

An "H" level voltage used in the EEPROM of this invention may be produced by boosting a power source voltage Vcc of the EEPROM. A booster circuit 60 for producing an "H" level voltage is shown in FIG. 5. In FIG. 5, a predetermined number of MOSFETs Qv1, Qv2, . . . , Qvn are connected in series between MOSFET Qr serving as a load transistor and "H" level voltage output terminal Vh. The gate of each FET Qvi is connected in common to its drain and is also connected to first clock signal line 62 through a corresponding one of capacitors Cv1, Cv3, . . . . The gate of each FET Qvi is connected in common to its drain and is also connected to second clock signal line 64 through a corresponding one of capacitors Cv2, Cv4, . . . . First and second clock signals φ1 and φ2 having waveforms as shown in FIG. 6 are supplied to lines 62 and 64, respectively. Signals φ1 and φ2 are shifted from each other by predetermined phase λ. If power source voltage Vcc is 5 volts, the total voltage of the power source voltage is applied to capacitor Cv1 when load transistor Qr is rendered conductive; then, carriers are transferred to the neighboring capacitor Cv2 through FET Qv1 using signals φ1 and φ2 and stored therein. Similarly, the stored carriers in capacitor Cv2 are sequentially transferred to the neighboring capacitor Cv3. Such operation is repeated with respect to the remaining capacitors, thereby to finally obtain "H" level voltage Vh.

Figure 7:
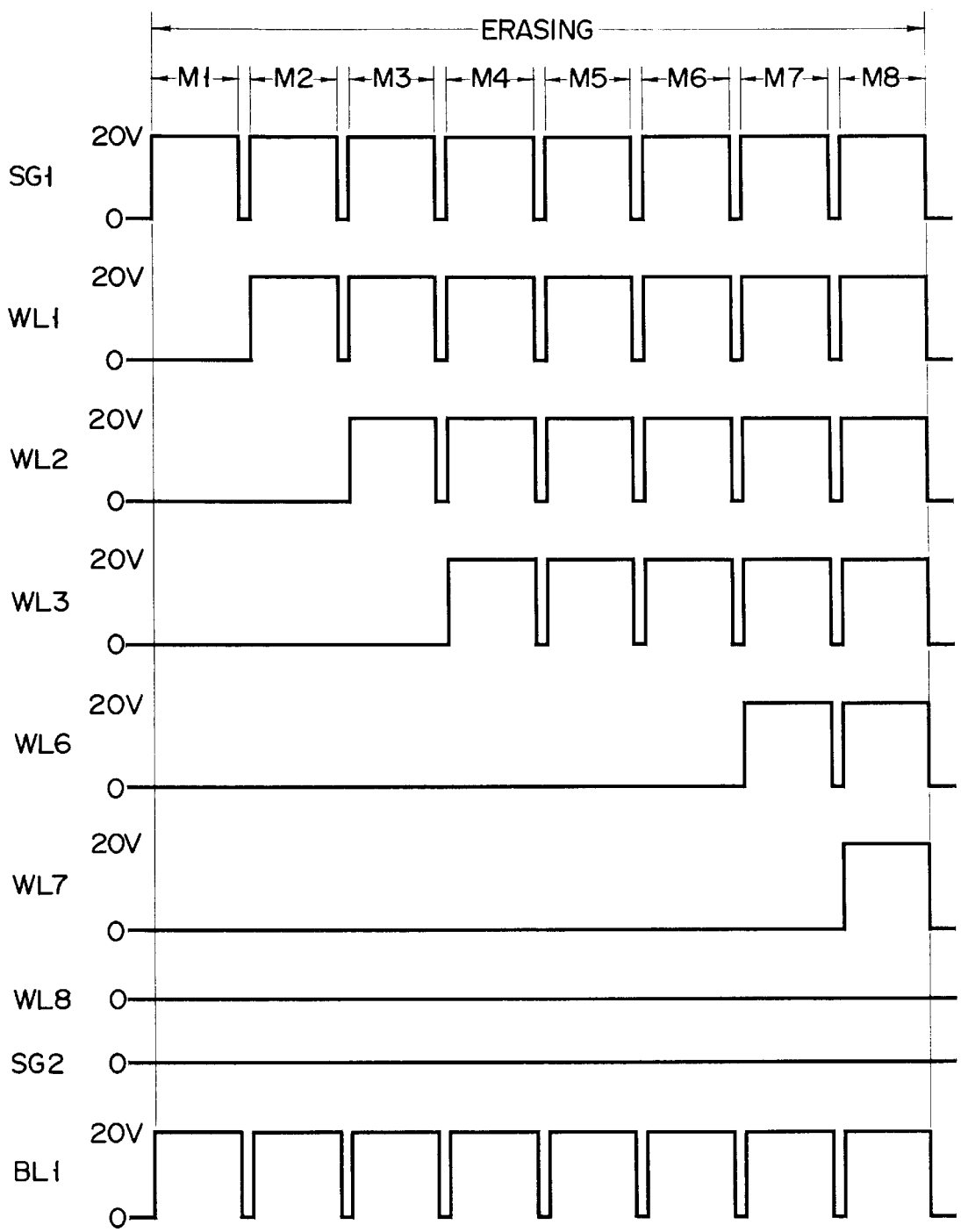
FIG. 7 is a diagram showing some typical waveforms of voltage signals which are generated at the main parts of the EEPROM in the data erase mode thereof.
Figure 8:
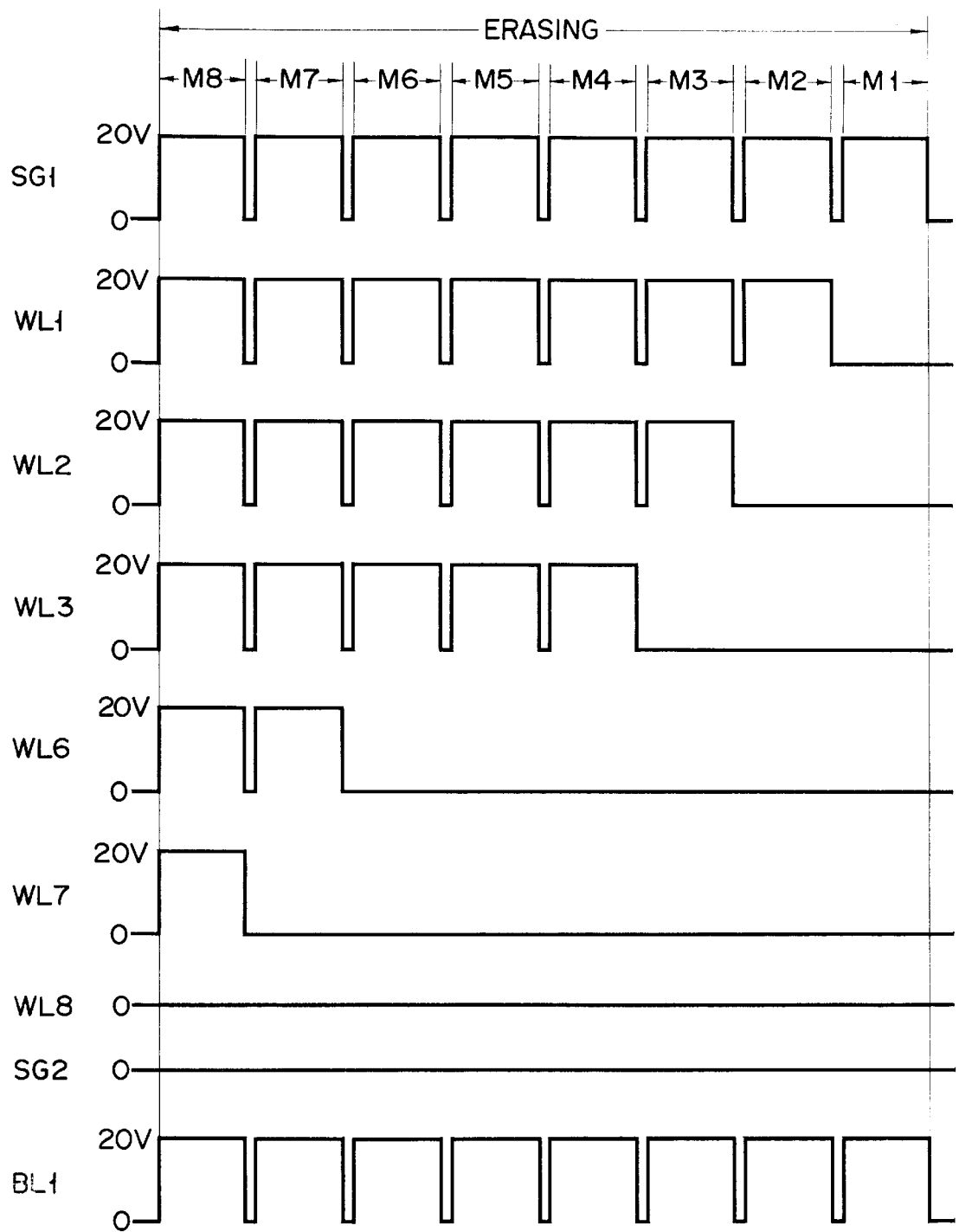
FIG. 8 is a diagram showing other typical waveforms of voltage signals which are generated at the main parts of the EEPROM in the data erase mode thereof.

An operation of the NAND cell type EEPROM with the above arrangement will now be described below with reference to the waveform charts in FIGS. 7 and 8. First, the EEPROM is subjected to a sequential data erase operation before data is selectively written. One NAND cell block B1 in the memory cell matrix shown in FIG. 1 is exemplified and a data erase operation of the memory cells in the cell block B1 will be described below. Since the same operation is performed in the remaining blocks, a redundant description will be omitted. Note that, in FIGS. 7 and 8, the waveforms of voltage signals in the word lines WL4 and WL5 are omitted only for the sake of illustrative convenience. In FIGS. 7 and 8, the memory cells M11, M12, . . . , M18 are simply designated to be "M1", "M2", . . . , "M8", since the description is limited to the memory cells in the NAND cell block B1.

In a data erase mode, an "H" level potential Vh (e.g., 20 volts) is applied to the control gate line SG1, as shown in FIG. 7. The selection transistor Qs11 is rendered conductive, so that the cell block B1 is electrically connected with the corresponding bit line BL1. At the same time, an "L" level potential v1 (e.g., 0 volts) is applied to the control gate line SG2, and the selection transistor Qs12 is rendered nonconductive. Therefore, the cell block Bi is electrically isolated from the substrate potential Vs, i.e., the substrate 22.

Under such a condition, the memory cell M1 which is positioned nearest to a node with the bit line BL1 in the memory cells M1 to M8 (to be referred to as "M1", "M2", . . . , "M8", hereinafter) in the NAND cell block B1 is subjected to a data erase operation. Then, the memory cell M2 adjacent to the memory cell M1 is subjected to a data erase operation, and the memory cells M3, M4, . . . , are sequentially subjected to a data erase operation. A memory cell which is positioned farthest from the node with the bit line B1, i.e., the memory cell M8 positioned adjacent to the second selection transistor Qs12 is lastly subjected to a data erase operation. It should be noted that electrons accumulated in the floating gate 28 in the cell are discharged to the substrate 22 or its drain layer and the threshold value of the transistor in the cell is shifted in the negative direction, thus performing a data erase operation for each memory cell. In other words, an operation for storing logic "1" data in each of the cell transistors M1 to M8 allows the data erase operation in the NAND cell block B1 of the EEPROM.

As shown in FIG. 7, in order to first erase data in the memory cell M1, an "H" level voltage (20 volts) is supplied to the bit line BL1, and an "L" level potential (0 volts) is applied to the word lines WL1 to WL8. The "H" level potential of the bit line BL1 is applied to the drain layer (the N+ layer 42 in FIG. 4) of the memory cell M1 through the first selection transistor Qs11. In the memory cell M1, a high-intensity electric field is formed between the floating gate 28 thereof and the substrate 22. The electric charges, i.e., electrons accumulated in the floating gate 28 are discharged to the substrate 22 and the drain 42. As a result, the threshold value of the memory cell transistor M1 is shifted in the negative direction, and the transistor has a voltage of, e.g, −2 volts. At this time, the memory cell M1 is in an erase state.

As shown in FIG. 7, in order to erase data in the memory cell M2, an "H" level voltage (20 volts) is supplied to the bit line BL1, and an "L" level potential (0 volts) is applied to the word lines WL2 to WL8. Under such a condition, an "H" level voltage (20 volts) is applied to only the word line WL1 connected to the gate of the memory cell transistor M1 whose data has been erased. At this time, the "H" level potential of the bit line BL1 is transferred to the drain layer of the memory cell M2 through the first selection transistor Qs11 and the memory cell M1. In the memory cell M2, a high-intensity electric field is formed between the floating gate thereof and the substrate 22. The electrons accumulated in the floating gate are discharged to the substrate 22 and the drain 44. As a result, the threshold value of the memory cell transistor M2 is shifted in the negative direction, and the transistor has a threshold voltage of, e.g., −2 volts. Therefore, the memory cell M2 is erased.

As shown in FIG. 7, in order to erase data in the memory cell M3, an "H" level voltage (20 volts) is applied to the word lines WL1 and WL2 connected to the above-mentioned memory cell transistors M1 and M2 whose data have been already erased. With such a voltage application, the "H" level potential of the bit line BL1 is transferred to the drain layer of the memory cell M3 through the first selection transistor Qs11 and the memory cells M1 and M2, a high-intensity electric field is formed in the memory cell M3, and the data in the memory cell M3 is erased in the same manner as in the memory cells M1 and M2.

The same operations as in the above cases are repeated, and data in the remaining memory cells M4, M5, M6, and M7 are sequentially erased, in the order named. When data in the last memory cell M8 in the NAND cell block B1 is erased, an "H" level voltage (20 volts) is applied to the word lines WL1 to WL7 connected to the memory cells M1 to M7 whose data are erased, as shown in FIG. 7. At this time, the "H" level potential of the bit line BL1 is transferred to a drain layer 50 of the memory cell M8 through the first selection transistor Qs11 and the memory cells M1 to M7, a high-intensity electric field is formed in the memory cell M8, and data in the memory cell M8 is erased.

The sequential order that the memory cells M1 to M8 in the NAND cell block B1 are subjected to a data erase operation is not limited to that in the above-mentioned case. As shown in FIG. 8, the order may be modified such that after the data in the memory cell M8 which is positioned farthest from the bit line BL1 is first erased, the data in the memory cells M7, M6, M5, . . . are sequentially erased, and the data in the memory cell M1 which is positioned nearest to the bit line BL1 is lastly erased.

A data write operation in the memory cells M1 to M8 in the NAND cell block B1 is performed in the order opposite to the aforementioned data erasing order shown in FIG. 7. That is, the memory cell M8 which is positioned farthest from a node with the bit line BL1 corresponding to the cell block B1 is first subjected to a data write operation, and the memory cell M1 which is positioned nearest to the node with the bit line B1 is lastly subjected to the data write operation. It should be noted that electrons are injected into the floating gate 28 of the cell and the threshold value of the transistor of the cell is shifted in the positive direction, thus performing a data write operation in each memory cell.

Figure 9:
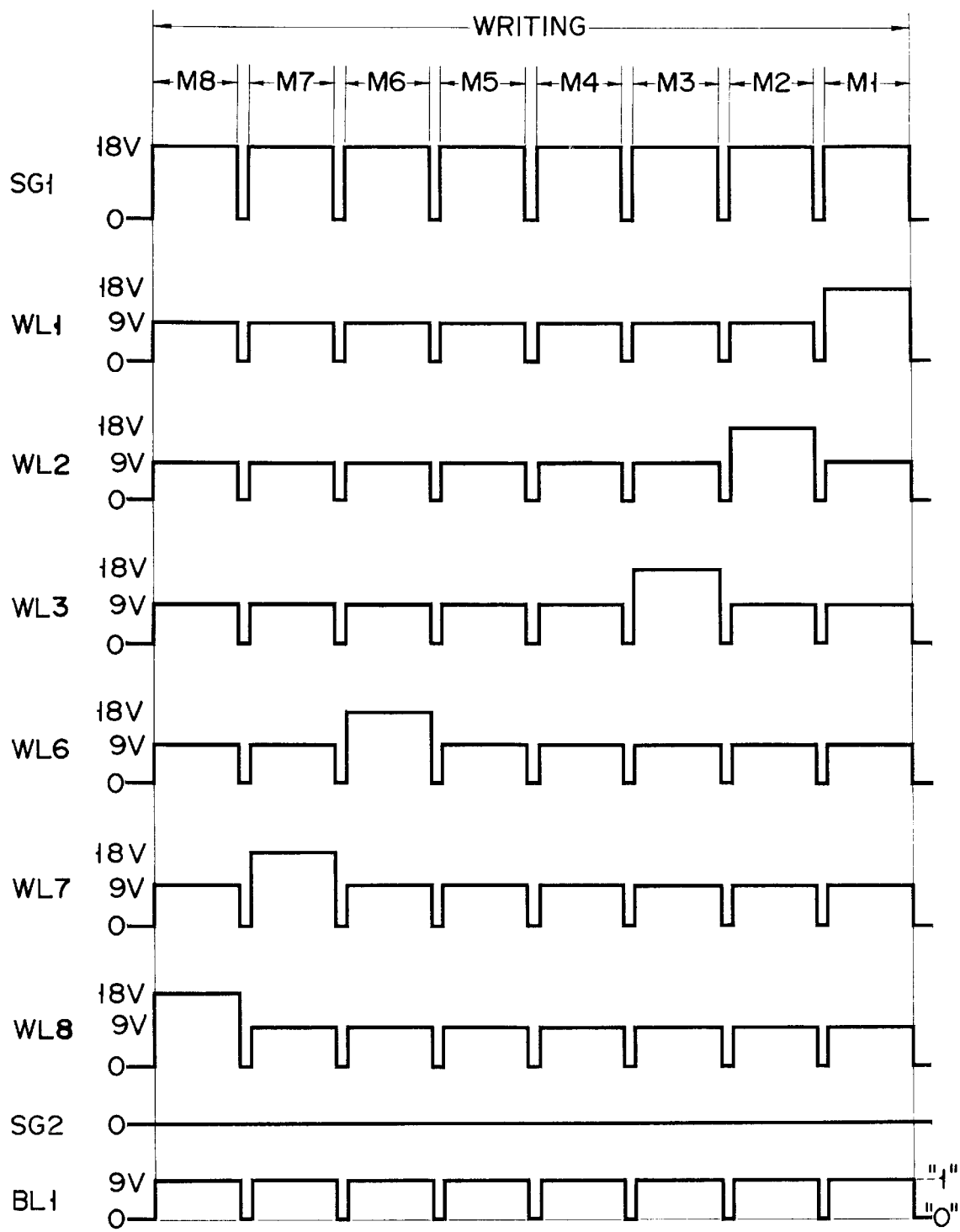
FIG. 9 is a diagram showing some typical waveforms of voltage signals which are generated at the main parts of the EEPROM in the data write mode thereof.

As shown in FIG. 9, in a data write mode, an "H" level potential (e.g., 18 volts) is applied to the control gate line SG1. The selection transistor Qs11 is rendered conductive, whereby the cell block B1 is electrically connected with the corresponding bit line BL1. At the same time, an "L" level potential (e.g., 0 volts) is applied to the control gate line SG2, and the selection transistor Qs12 is rendered nonconductive. The cell block B1 is thus electrically isolated from the substrate potential Vs, i.e., the substrate 22.

In the NAND cell block B1, first, the memory cell M8 is selected. At this time, as shown in FIG. 9, an intermediate voltage Vm (e.g., 9 volts) is applied to the word lines WL1 to WL7 of the non-selected memory cells M1 to M7, and an "H" level potential (e.g., 18 volts) is applied to the word line WL8 of the selected memory cell M8. Under such a condition, when logic "0" data ("L" level potential, i.e., 0 volts) is supplied to the corresponding bit line BL1 by the control circuit 10 and the column decoder 12, a high-intensity electric field is formed between the floating gate of the selected memory cell M8 and the substrate 22 (the drain 50 of the selected memory cell M8), and a tunnel current flows therebetween. Therefore, electrons are injected into the floating gate by a tunnel effect. As a result, the threshold value of the memory cell M8 is shifted in the positive direction, and the memory cell M8 has a threshold value of, e.g., 2 volts. This state corresponds to storage of logic "0" data. In this state, in the remaining, non-selected memory cells M1 to M7, an intermediate potential Vm is applied to their control gates, and a low-intensity electric field is formed between the control gates and the substrate 22. Therefore, these non-selected memory cells are kept in an erase state.

Under the above condition, when logic "1" data is stored in the selected memory cell M8, an "H" level potential (e.g., 9 volts) may be applied to the bit line BL1. In other words, injection of electrons into the floating gate of the selected memory cell M8 is stopped, and the memory cell M8 is set in the erase state, thus storing the logic "1" data.

Then, the neighboring cell M7 is selected as a data write object. At this time, the potential of the word line WL8 connected to the memory cell M8 to which data has been written is changed to an "L" level potential or an intermediate potential Vm (as shown in FIG. 9, an intermediate potential Vm is employed in this embodiment), and the potential of the word line WL7 connected to the selected memory cell M7 is increased from the intermediate potential Vm to an "H" level voltage Vh. The potentials of the word lines WL2 to WL6 respectively connected to the remaining memory cells M2 to M6 are continuously set at the intermediate potential Vm. As a result, desired logical data is written in the selected memory cell M7 by the same mechanism as in the above cases.

In the NAND cell block B1, after the memory cells M6, M5, M4, M3, and M2 are subjected to a data write operation in the order named and in the same manner as in the above cases, the memory cell M1 is lastly selected. At this time, the potential of the word lines WL2–WL8 connected to the memory cells M2 to M8 in which data are written is changed to an "L" level potential or an intermediate potential Vm (as shown in FIG. 9, an intermediate potential Vm is employed in this embodiment), and only the potential of the word line WL1 connected to the selected memory cell M1 is increased from the intermediate potential Vm to the "H" level voltage Vh. As a result, desired logical data is written in the selected memory cell M1 in the same mechanism as in the above cases.

It should be noted that while the above-mentioned sequential data writing is performed in the NAND cell block B1, in the neighboring cell block B2, a voltage corresponding to write data is supplied to the corresponding bit line BL2, thus writing data in the memory cells connected to the single word line WLi. For example, while the memory cell M7 in the NAND cell block B1 i.e., the memory cell M17 in FIG. 1 is selected, a data potential is applied to the bit line BL2, so that desired logical data can be simultaneously written in the memory cell M27 in the neighboring cell block B2 connected together to the word line WL7 of the cell M17.

When data is read out from a desired memory cell Mij in a data read mode, an "L" level potential (0 volts) is applied to only a word line WLj connected to the selected memory cell Mij, and a preselected read voltage Vr (5 volts, for example) is applied to the gate control lines SG1 and SG2 and the remaining word lines. When a predetermined voltage, e.g., 1 volt is applied to a bit line BLi connected to the selected memory cell Mij, it is sensed whether a current is supplied to the bit line BLi, so that it is determined whether data stored in the selected memory cell is logic "1" data or logic "0" data. When the threshold value of the selected cell is high, i.e., the selected cell is in a logic "0" data storing state, a current is not supplied to the bit line BLi. When the threshold value of the selected cell is low, i.e., the selected cell is in a logic "1" data storing state, a current is supplied to the bit line BLi.

For example, when data stored in the memory cell M3 in the NAND cell block B1 is read out, a read voltage of 5 volts is applied to the lines SG1, WL1, WL2, WL4 to WL8, and SG2, and only the potential of the word line WL3 is set at 0 volts. If a voltage of 1 volt is applied to the bit line BL1 and the flow of a current is sensed, it is determined that data stored in the selected cell M3 is logic "1" data. At this time, if the flow of a current cannot be sensed, it is determined that data stored in the selected cell M3 is logic "0" data.

With such an arrangement, when a memory cell Mi in the NAND cell clock B1 is selected in the sequential data erase mode or the sequential data write mode, a transmission efficiency of a data voltage from the corresponding bit line BL1 to the selected memory cell Mi can be increased for the following reasons. According to the EEPROM of the present invention, electrons are injected into the floating gate of each memory cell. Therefore, a state wherein a threshold value of the memory cell has a negative value is defined as an "erase state", i.e., a logic "1" data storing state. A state wherein the threshold value of the MOSFET for constituting each memory cell is negative corresponds to a depletion state of the MOSFET. When an "H" level voltage Vh serving as write data is transferred from the bit line BL1 to the selected memory cell Mi, the threshold values of the non-selected memory cell transistors M1, M2, Mi−1 which are positioned between the bit line BL1 and the selected memory cell Mi in the NAND cell block B1 are decreased to be a negative value. A voltage drop in these transistors M1, M2, . . . , Mi−1 is minimized, and therefore, a transfer loss in the transistors M1, M2, . . . , Mi−1 can be minimized. As a result, a data write efficiency of the EEPROM can be maximized. Improvement of the write efficiency allows a decrease in value of the voltage for defining the "H" level. This reduces a requirement associated with boosting performance of a booster arranged in the EEPROM, thus achieving a simple arrangement of the circuit. As a result, an arrangement of a peripheral circuit of the EEPROM can be simplified, and the simple arrangement will greatly contribute an improvement of the integration density of the EEPROM.

As shown in FIG. 10, an EEPROM according to another embodiment of the present invention includes a memory cell matrix section generally designated by reference numeral "70". The memory cell section 70 is different from that in the embodiment in FIG. 1 because a first selection transistor Qs1 is omitted in each NAND cell block Bi in the memory cell section 70. Since the remaining parts are basically the same as those in the embodiment in FIG. 1, the same reference numerals denote the corresponding parts, and a detailed description thereof will be omitted only for the aim of simplification of specification. Allowance of use of the voltage having a decreased potential as an "H" level potential obtained by improving a voltage transmission efficiency in the above-mentioned data write/erase mode permits such an omission of the first selection transistor in each NAND cell block Bi for the first time. In this embodiment, the power supply voltage Vcc of the EEPROM is used as an intermediate potential Vm without conversion into a voltage having a potential increased by, e.g., a booster 60 shown in FIG. 5.

More specifically, each NAND cell block Bi is connected to the corresponding bit line BLi associated therewith in the drain of the first memory cell Mi1 in the memory cells included in the NAND cell block Bi. For example, as shown in an enlarged view of FIG. 11 in detail, in the NAND cell block B1, the memory cell transistor M11 is directly connected to a wiring layer 24 constituting the bit line BL1 through a contact hole 20. AS shown in FIG. 13, an N$^+$ type layer 40 serving as a drain layer of the transistor M11 is connected to the bit line layer 24 through the contact hole 20. The remaining arrangement of the cell block B1 is substantially the same as that shown in FIG. 4. In particular, as is immediately understood when FIGS. 3 and 12 are viewed in comparison with each other, a sectional structure of each memory cell may be completely the same as that in the above embodiment.

As shown in FIG. 14, in a sequential data erase mode, a voltage of 15 volts is used as an "H" level voltage Vh. A timing of voltage application to the selected and non-selected memory cells in each NAND cell block Bi is the same as that in FIG. 7.

As shown in FIG. 15, in a sequential data write mode, a power supply voltage Vcc is directly used without boosting as an intermediate potential Vm to be applied to the non-selected memory cells connected to the bit line BL1. A voltage to define stored logic "1" data is also the power supply voltage Vcc. A voltage of 15 volts is applied to the selected memory cell in which logic "0" data is to be written. A timing of voltage application to the selected and non-selected memory cells in each NAND cell block Bi is the same as that in FIG. 9.

With such an arrangement, only two types of voltages, i.e., a power supply voltage Vcc of 5 volts and a boosted voltage of 15 volts are basically required for an operation of the EEPROM. Therefore, a remarkably simplified arrangement of a peripheral circuit can be achieved as compared with that in the above embodiment. In addition, the first selection transistor Qs1 can be omitted in each NAND cell block. These facts greatly contribute to an improvement of the integration density of the EEPROM.

Although the invention has been described with reference to a specific embodiments, it shall be understood by those skilled in the art that numerous modifications may be made that are within the spirit and scope of the invention.

What is claimed is:

1. A non-volatile semiconductor memory device comprising:

a semiconductive substrate;

parallel bit lines provided above said substrate;

memory cells connected to said bit lines, said memory cells comprising cell blocks each of which has a series array of memory cell transistors connected at a first node thereof to a corresponding bit line associated therewith and connected at a second node thereof to said substrate, each of said memory cell transistors having a carrier storage layer and a control gate electrode; and means for sequentially programming selected memory cell transistors in such a manner as to write a logical data into a certain memory cell transistor which is presently selected from said memory cell transistors by injecting carriers by tunneling into the carrier storage layer of said certain memory cell transistor thereby to increase a threshold value thereof, and for sequentially erasing the selected memory cell transistors in a manner as to erase the data stored in said certain memory cell transistor by removing the carriers accumulated in said carrier storage layer thereby to decrease the threshold value of said certain memory cell transistor.

2. The device according to claim 1, wherein in a data writing mode said means includes means for storing in a selected memory cell transistor of a certain NAND cell block a data to be written supplied from a corresponding bit line associated with said certain NAND cell block, by applying an "H" level voltage to the control gate of said selected transistor, applying the control gates of non-selected memory cell transistors of said certain cell block with an intermediate voltage which is lower than the "H" level voltage and yet higher than an "L" level voltage in a data write mode of said device.

3. The device according to claim 2, wherein in a data erasing mode said means includes means for erasing the content of said selected memory cell transistor, by applying the "L" level voltage to the control gate of said selected transistor, applying the "H" level voltage to the control gates of first non-selected memory cell transistors of said certain NAND cell block which are positioned between said selected transistor and said first node connected to the corresponding bit line associated with said cell block, and applying the "L" level voltage to the control gates of second non-selected memory cell transistors consisting of the remaining memory cell transistors of said certain cell block in a data erase mode of said device.

4. The device according to claim 3, wherein said means includes means for sequentially designating one of the memory cell transistors included in said certain cell block in the data write mode.

5. The device according to claim 3, wherein said means includes means for sequentially designating one of the memory cell transistors included in said certain cell block in the data erase mode.

6. The device according to claim 4, wherein said means includes means for first selecting from said certain cell block a specific memory cell transistor which is positioned farthest from said first node of said certain cell block along said series array of memory cell transistors of said certain cell block in the data write mode, and selecting lastly another specific memory cell transistor from said certain cell block, said another specific memory cell transistor being positioned nearest to said first node along said series array.

7. The device according to claim 5, wherein said means includes means for first selecting from said certain cell block a specific memory cell transistor which is positioned nearest to said first node of said certain cell block along said series array of memory cell transistors of said certain cell block in the data erase mode, and selecting lastly another specific memory cell transistor from said certain cell block, said another specific memory cell transistor being positioned farthest from said first node along said series array.

8. The device according to claim 5 wherein said means includes means for first selecting from said certain cell block a specific memory cell transistor which is positioned farthest from said first node of said certain cell block along said series array of memory cell transistors of said certain cell block in the data erase mode, and selecting lastly another specific memory cell transistor from said certain cell block, said another specific memory cell transistor being positioned nearest to said first node along said series array.

9. The device according to claim 8, wherein said means uses a power supply voltage of said device as said intermediate voltage.

10. An electrically erasable programmable read-only memory device comprising:

a semiconductive substrate;

parallel bit lines on said substrate;

parallel word lines defining crossing points between said bit lines and said word lines on said substrate;

floating gate type field effect transistors provided at said crossing points to serve as memory cells of said device, said transistors including a cell array which has a series-circuit of cell transistors for constituting a NAND cell structure, each of said cell transistors having an electrically floating gate and a control gate which is connected to a corresponding word line;

a field effect transistor provided in said cell array having a gate layer, and serving as a switching transistor which selectively connects said cell array to a substrate voltage;

a gate control line connected to said gate layer of said switching transistor;

sequential program means coupled to said word lines, for sequentially writing selected memory cells by injecting carriers by tunneling into said floating gate; and sequential erase means connected to said word lines and said gate control line, for, when a desired cell is sequentially selected from among the memory cells of said cell array, (i) applying said gate control line with an "L" level voltage which renders said switching transistor nonconductive thereby to disconnect said cell array from said substrate voltage, (ii) for applying the "L" level voltage to a selected word line which is connected with said desired cell, (iii) for applying an "H" level voltage to word lines connected to first non-selected memory cells of said cell array which are positioned between said desired cell and corresponding bit line associated with said cell array, and (iv) for applying the "L" level voltage to word lines which are connected to second non-selected memory cells of said cell array which are positioned between said desired cell and said switching transistor, whereby said desired cell is subjected to data erasing.

11. The device according to claim 10, wherein said erase means includes means for executing a sequential data erasing operation in such a manner that a specific memory cell which is positioned adjacent to a connection node between said cell array and said bit line associated therewith is first selected from said cell array and that another specific memory cell which is positioned adjacent to said switching transistor included in said cell array is selected lastly from said cell array.

12. The device according to claim 10, wherein said erase means includes means for executing a sequential data erasing operation in such a manner that a specific memory cell which is positioned adjacent to said switching transistor included in said cell array is first selected from said cell array and that another specific memory cell which is positioned adjacent to a connection node between said cell array and said bit line associated therewith is selected lastly from said cell array.

13. The device according to claim 10, further comprising:

(h) write means connected to said word lines and said gate control line, for, when a selected cell is sequentially designated from among the memory cells of said cell array, (i) applying said gate control line with the "L" level voltage which renders said switching transistor nonconductive thereby to disconnect said cell array from said substrate voltage, (ii) for applying the "H" level voltage to a selected word line which is connected with said desired cell, (iii) for applying an intermediate voltage of a voltage potential between the "H" level voltage and the "L" level voltage to word lines connected to non-selected memory cells of said cell array, whereby a logical data which is supplied from said bit line is stored in the desired cell.

14. The device according to claim 13, wherein said write means includes means for executing a sequential data writing operation in such a manner that a specific memory cell which is positioned adjacent to said switching transistor included in said cell array is first selected from said cell array and that another specific memory cell which is positioned nearest to a connection node between said cell array and said bit line associated therewith is selected lastly from said cell array.

15. The device according to claim 14, wherein said write means uses as said intermediate voltage a power supply voltage which is externally supplied to said memory device.

16. The device according to claim 15, wherein said power supply voltage is a d.c. voltage which is lower than 10 volts.

17. A data accessing method for a non-volatile semiconductor memory device comprising parallel bit lines provided above a semiconductive substrate, memory cells connected to said bit lines, said memory cells comprising cell blocks each of which has a series array of memory cell transistors connected at a first node thereof to a corresponding bit line associated therewith and connected at a second node thereof to said substrate, each of said memory cell transistors having a carrier storage layer and a control gate electrode, said method comprising the steps of:

sequentially writing selected memory cell transistors in such a manner as to program a logical data into a certain memory cell transistor which is presently selected from said memory cell transistors by injecting carriers by tunneling into the carrier storage layer of said certain memory cell transistor thereby to increase a threshold value thereof; and sequentially erasing the selected memory cell transistors so as to erase the data stored in said certain memory cell transistor by removing the carriers accumulated in said carrier storage layer thereby to decrease the threshold value of said certain memory cell transistor.

18. The method according to claim 17, wherein, when a selected memory cell transistor of a certain NAND cell block is designated, a data to be written supplied from a corresponding hit line associated with said certain NAND cell block is stored in said selected memory cell transistor by applying an "H" level voltage to the control gate of said selected transistor, applying the control gates of non-selected memory cell transistors of said certain cell block with an intermediate voltage which is lower than the "H" level voltage and yet higher than an "L" level voltage in a data write mode of said device.

19. The method according to claim 18, wherein the content of said selected memory cell transistor is erased by applying the "L" level voltage to the control gate of said selected transistor, applying the "H" level voltage to the control gates of first non-selected memory cell transistors of said certain NAND cell block which are positioned between said selected transistor and said first mode connected to the corresponding bit line associated with said cell block, and applying the "L" level voltage to the control gates of second non-selected memory cell transistors consisting of the remaining memory cell transistors of said certain cell block in a data erase mode of said device.

20. The method according to claim 19, wherein the memory cell transistors included in said certain cell block are sequentially designated in the data write mode.

21. The method according to claim 19, wherein the memory cell transistors included in said certain cell block are sequentially designated in the data erase mode.

22. The method according to claim 20, wherein a specific memory cell transistor which is positioned farthest from said first node of said certain cell block along said series array of memory cell transistors of said certain cell block is first selected from said certain cell block in the data write mode, and wherein another specific memory cell transistor is lastly selected from said certain cell block, said another specific memory cell transistor being positioned nearest to said first node along said series array.

23. The method according to claim 21, wherein a specific memory cell transistor which is positioned nearest to said first node of said certain cell block along said series array of memory cell transistors of said certain cell block is first selected from said certain cell block in the data erase mode, and wherein another specific memory cell transistor is lastly selected from said certain cell block, said another specific memory cell transistor being positioned farthest from said first node along said series array.

24. The method according to claim 21, wherein a specific memory cell transistor which is positioned farthest from said first node of said certain cell block along said series array of memory cell transistors of said certain cell block is first selected from said certain cell block in the data erase mode, and wherein another specific memory cell transistor is lastly selected from said certain cell block, said another specific memory cell transistor being positioned nearest to said first node along said series array.

25. The device according to claim 9, comprising each of said bit lines being connected directly to an active layer of a corresponding of said memory cell transistors at a corresponding of said first nodes.

26. An electrically erasable and programmable semiconductor memory device comprising:

a semiconductive substrate;

bit lines above said substrate;

an array of memory cells associated with said bit lines, said memory cells including a plurality of cell sections having series-connected memory cell transistors, each of said memory cell transistors having a carrier storage layer and a control gate electrode;

sequential program means for allowing selected memory cells to be sequentially written with data in a predetermined order; and voltage controller means associated with said array of memory cells, for potentially controlling the control gate electrode of each of said memory cell transistors in such a manner as to cause electrical carriers to tunnel to the carrier storage layer of a selected memory cell transistor increasing its threshold voltage, thereby programming the selected memory cell transistor, said voltage controller means causing electrical carriers to tunnel from the carrier storage layer of the selected memory cell transistor decreasing the threshold voltage, thereby erasing the selected memory cell transistor;

said voltage controller means including means for sequentially controlling the potential at the control gates of those memory cell transistors in each cell section so that said those memory cell transistors are erased sequentially.

27. The device according to claim 26, wherein said voltage controller means further comprises means for causing said memory cell transistors in each cell section to be erased in a forward order in relation to respective positions in said each cell section.

28. The device according to claim 26, wherein said voltage controller means further comprises means for causing said memory cell transistors in each cell section to be erased in a reverse order in relation to respective positions in said each cell section.

29. The device according to claim 26, further comprising:

transfer gate means connected between said cell sections and a common source potential of said device, for coupling said cell sections to the common source potential.

30. The device according to claim 29, further comprising:

second transfer gate means connected between said bit lines and said cell sections, for electrically coupling a selected bit line to a corresponding one of said cell sections.

31. The device according to claim 26, wherein each of said memory cell transistors comprises an insulated gate transistor.

32. The device according to claim 31, wherein said substrate has a surface in which said insulated gate transistors are arranged.

33. The device according to claim 31, wherein said substrate has a selected type of conductivity which is opposite to a conductivity type of a source and a drain layer of said insulated gate transistors.

34. The device according to claim 33, wherein said insulated gate transistors include floating-gate tunneling metal oxide semiconductor transistors.

* * * * *